United States Patent
Ying et al.

(10) Patent No.: US 10,510,410 B2
(45) Date of Patent: Dec. 17, 2019

(54) METHOD FOR PROGRAMMING RESISTIVE MEMORY CELL WITH AC PERTURBATION AC SIGNAL AND NONVOLATILE MEMORY DEVICE THEREOF

(71) Applicant: Taiwan Semiconductor Manufacturing Co., Ltd., Hsinchu (TW)

(72) Inventors: Ji-Feng Ying, Hsinchu (TW); Baohua Niu, Hsinchu (TW); Jhong-Sheng Wang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 19 days.

(21) Appl. No.: 15/905,699

(22) Filed: Feb. 26, 2018

(65) Prior Publication Data

US 2019/0147950 A1    May 16, 2019

Related U.S. Application Data

(60) Provisional application No. 62/584,929, filed on Nov. 13, 2017.

(51) Int. Cl.
*G11C 13/00* (2006.01)

(52) U.S. Cl.
CPC ........ *G11C 13/0069* (2013.01); *G11C 13/004* (2013.01); *G11C 13/0038* (2013.01); *G11C 2013/0078* (2013.01)

(58) Field of Classification Search
CPC .............. G11C 13/0069; G11C 13/004; G11C 13/0038; G11C 2013/0078; G11C 5/147; G11C 5/14
See application file for complete search history.

(56) References Cited

U.S. PATENT DOCUMENTS

| | | | |
|---|---|---|---|
| 8,837,197 B2 * | 9/2014 | Oh ..................... | G11C 13/0004 365/148 |
| 2013/0128683 A1 * | 5/2013 | Kim ..................... | G11C 5/147 365/226 |
| 2017/0301399 A1 * | 10/2017 | Han ..................... | G11C 13/004 |

* cited by examiner

*Primary Examiner* — David Lam
(74) *Attorney, Agent, or Firm* — JCIPRNET (57) ABSTRACT

In the disclosure, a non-volatile memory device includes a resistive memory cell and a write and read circuit. The write and read circuit is coupled to the resistive memory cell and configured to combine a perturbation AC signal with a first writing signal, so as to generate a second writing signal. Then, the write and read circuit applies the second writing signal to the resistive memory cell to program the resistive memory cell. The combination of the oscillation signal and the first writing signal (constant DC signal) and AC signal would penetrate the shielding effect of the insulating layer and free the stuck charges.

20 Claims, 7 Drawing Sheets

METHOD FOR PROGRAMMING RESISTIVE MEMORY CELL WITH AC PERTURBATION AC SIGNAL AND NONVOLATILE MEMORY DEVICE THEREOF

CROSS-REFERENCE TO RELATED APPLICATION

This application claims the priority benefit of U.S. provisional application Ser. No. 62/584,929, filed on Nov. 13, 2017. The entirety of the above-mentioned patent application is hereby incorporated by reference herein and made a part of this specification.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for a next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, as used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

The terms used in this specification generally have their ordinary meanings in the art and in the specific context where each term is used. The use of examples in this specification including examples of any terms discussed herein, is illustrative only, and in no way limits the scope and meaning of the disclosure or of any exemplified term. Likewise, the present disclosure is not limited to various embodiments given in this specification.

The present disclosure is related to a resistive non-volatile memory device. The resistive non-volatile memory device generally includes an insulating layer of high-k dielectric material arranged between conductive electrodes disposed within a back-end-of-the-line (BEOL) metallization stack. The resistive non-volatile memory devices are configured to operate based upon a process of reversible switching between resistive states. This reversible switching is enabled by selectively forming a conductive filament through the insulating layer of high-k dielectric material. For example, the insulating layer of high-k dielectric material, which is normally insulating, can be made to conduct by applying a voltage across the conductive electrodes to form a conductive filament extending through the insulating layer of high-k dielectric material (also referred to electroforming process.) A resistive memory cell having a first (e.g., high) resistive state corresponds to a first data value (e.g., a logical "0") and a resistive memory cell having a second (e.g., low) resistive state corresponds to a second data value (e.g., a logical "1"). The logical bit of the first and second data values may be reversed, where the first data value may be referred to as a logical "1", and the second data value may be referred to as a logical "0". In some exemplary embodiments, an operation of programming a resistive memory cell from the low resistive state to the high resistive state may be referred to as a RESET operation of the resistive memory cell. On the other hand, an operation of programming a resistive memory cell from the high resistive state to the low resistive state may be referred to as a SET operation of the resistive memory cell.

After the electroforming process, the operation of the resistive memory cell involves the migration of charges in the insulating layer. In a programming process of the resistive memory cell, a write signal (e.g., voltage or current) may be applied to the resistive memory cell to program the resistive memory cell to either a high resistive state or a low resistive state. However, the charges in the insulating layer may be stuck or trapped in the conductive filament, which results in a shielding effect on the insulating layer. The write signal is usually a constant voltage which may not have sufficient energy to penetrate this shielding effect. In the disclosure, an AC signal having an electrical characteristic of high frequency oscillation is added to the constant write signal (voltage or current) as to penetrate the shielding effect of this insulating layer made of the dielectric material and break free the charges that are stock in the insulating layer.

Figure 1:
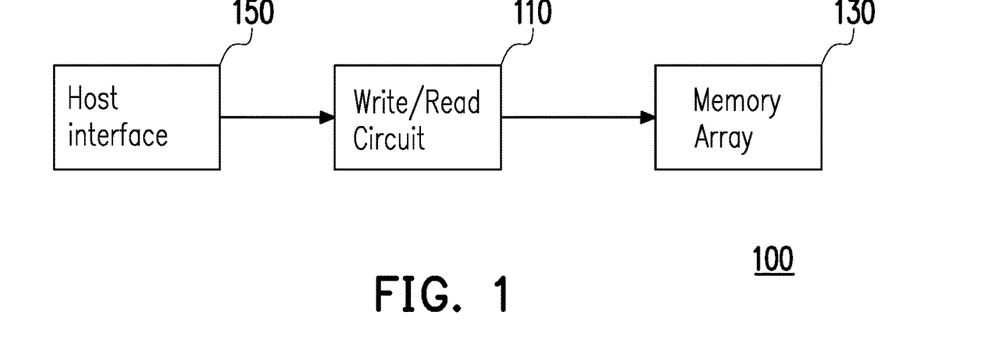
FIG. 1 is a diagram illustrating a diagram illustrating a memory device according to some exemplary embodiments of the disclosure.

FIG. 1 is a diagram illustrating a diagram illustrating a memory device 100 according to some exemplary embodiments of the disclosure. In the exemplary embodiments, the memory device 100 may be a storage drive, a flash drive, a memory card, a memory stick, an integrated circuit, or other device or circuit element that includes resistive memory cells. With reference to FIG. 1, the memory device 100 includes a write and read circuit 110, a memory array 130, and a host interface 150. In some exemplary embodiments, the write and read circuit 110, the memory array 130, and the host interface 150 may be disposed on the same memory integrated circuit (IC) or memory die, however, the disclosure is not limited thereto.

The write and read circuit 110 reads from or writes to the memory array 130. The write and read circuit 110 may receive commands and data from a host (not shown) through the host interface 150. The command may be a write command, read command, erase command, format command, etc. In the exemplary embodiments, the host interface may receive commands, information, data, etc. from the host in a wired or wireless manner, the disclosure is not intended to limit the type of the connection between the host (or other external devices) and the memory device 100.

Figure 2:
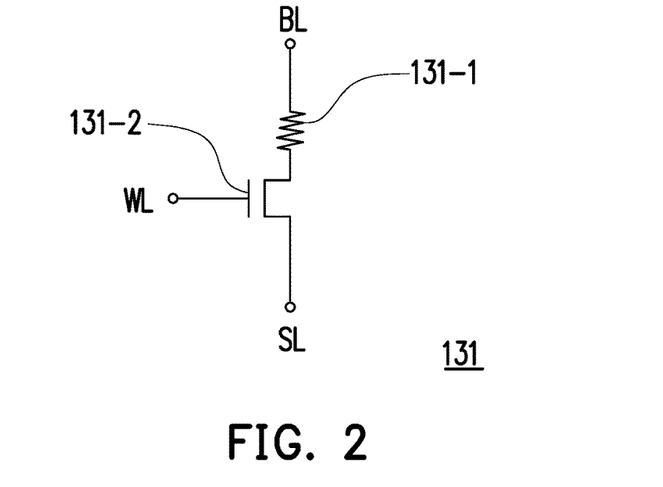
FIG. 2 is a diagram illustrating a resistive memory cell of the memory array according to some exemplary embodiments of the disclosure.

FIG. 2 is a diagram illustrating a resistive memory cell 131 of the memory array 130 according to some exemplary embodiments of the disclosure. The resistive memory cell 131 may be a unipolar resistive memory cell, a bipolar resistive memory cell, and the likes, the exemplary embodiments is not intended to limit the type of the resistive memory. The memory array 130 includes a plurality of resistive memory cells arranged in rows and columns.

Although FIG. 2 only shows one resistive memory cell, one having ordinary skilled in the art would understand that a plurality of the resistive memory cells 131 as illustrated in FIG. 2 may be arranged in rows and columns to form the memory array 130. With reference to FIG. 2, the resistive memory cell 131 includes a resistive element 131-1 and a switching element 131-2. In some exemplary embodiments, the resistive element 131-1 may be a semiconductor device made of an insulating layer arranged between conductive electrodes. The bottom electrode and the upper electrode may include a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the insulating layer of dielectric material may include nickel oxide (NiO), titanium oxide (TiO), hafnium oxide (HfO), zirconium oxide (ZrO), zinc oxide (ZnO), tungsten oxide (WO3), aluminum oxide ($Al_2O_3$), tantalum oxide (TaO), molybdenum oxide (MoO), and/or copper oxide (CuO), for example. In some exemplary embodiments, the switching element 131-2 includes a metal-oxide semiconductor field-effect transistor (MOSFET).

In some exemplary embodiments, the resistive element 131-1 and the switching element 131-2 are connected in series. A control terminal of the switching element 131-2 is connected to a word line WL. A first terminal of the resistive element 131-1 is connected to a bit line BL. A second terminal of the resistive element 131-1 is connected to a first terminal of the switching element 131-2 (e.g., a drain of the MOSFET). The second terminal of the switching element 131-2 (e.g., a source of the MOSFET) is connected to a source line SL.

The write and read circuit 110 is coupled to the resistive memory 131 through the word line WL, the bit line BL, and the source line SL, where the resistive memory 131 may be operated by signals applied to the word line WL, the bit line BL and/or the source line SL. In the exemplary embodiments, the resistive memory cell 131 may be selected using the word line WL. Signals (voltage or current) may be applied to the bit line BL for reading the resistive memory cell 131. Voltages across and/or currents through the resistive element 131-1 may be detected to determine resistive states of the resistive element 131-1. Although the exemplary resistive memory cell is described as having two different resistive states, in other exemplary embodiments, the resistive states of the resistive memory cell may include more than two resistive states.

In the exemplary embodiment, the resistive memory cell 131 may be selected using the word line WL and programmed to a first resistive state (e.g., a high resistance state) or a second resistive state (e.g., a low resistance state) using the bit line BL. For example, the resistive memory cell 131 may be programmed to the first resistive state or the second resistive state by passing current through the resistive element 131-1, where a signal (voltage or current) may be applied to the bit line BL.

Figure 3:
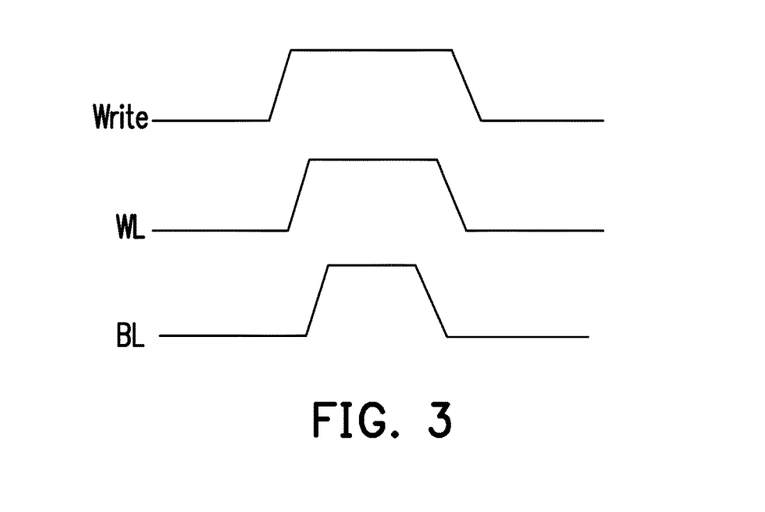
FIG. 3 is a timing diagram illustrating a typical write operation of the resistive memory cell.

FIG. 3 is a timing diagram illustrating a typical write operation of the resistive memory cell. With reference to FIG. 3, a select signal may be applied to the word line WL to select the resistive memory cell. Then, a write signal may be applied to the bit line BL to program the selected resistive memory cell. In the typical write operation, the select signal and the write signal may be constant voltage or current throughout a write phase. As described above, this electrical characteristic of constant voltage or current may not have sufficient energy to penetrate the shielding effect built up by the insulating layer, and thus the charges would remain stuck in the insulating layer. Therefore, in the exemplary embodiments, a perturbation signal is added to the select signal and/or write signal. The electrical characteristic of the AC signal may penetrate the shielding effect built up by the insulting layer. In other words, the AC signal reaches the stuck charges and provides enough energy to the stuck charges for moving toward a direction designated by the applied write signal. In some exemplary embodiments, the perturbation signal is also added to the source line. The source line may be coupled to a reference voltage, or sometime ground, but an insertion of the perturbation signal would still have effect to a circuit loop formed between the resistive memory cell 131 and the write and read circuit 110. In some exemplary embodiments, write signal (voltage or current) other than a reference voltage may also be applied to the source line, for example, a bipolar resistive memory cell. In the exemplary embodiments, the perturbation signal may be inserted from any terminal of the resistive memory cell 131 along with the constant signal of the typical write operation. The existence of the perturbation signal at any terminal of the resistive memory cell 131 would cause a disturbance in the circuit loop which may be formed when the resistive memory cell 131 is enabled for programming or write operation.

Figure 4:
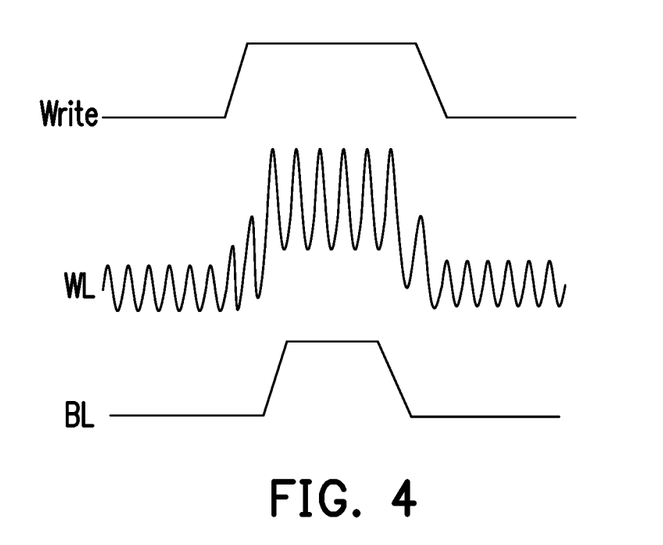
FIG. 4 is a timing diagram illustrating a write operation of the resistive memory cell according to some exemplary embodiments of the disclosure.

FIG. 4 is a timing diagram illustrating a write operation of the resistive memory cell according to some exemplary embodiments of the disclosure. In the exemplary embodiments, a perturbation signal such as a high frequency oscillation (or AC signal) may be added to the typical write constant signal illustrated in FIG. 3. In the exemplary embodiments, the perturbation signal is added to the signal (voltage or current) applied to the word line WL.

In some exemplary embodiments, the frequency of the oscillation signal may be between 3 to 30 megahertz. However, the embodiments of the disclosure are not intended to limit the value of the oscillation signal. For example, in some exemplary embodiments, the oscillation signal may be greater than 30 megahertz or in the gigahertz range.

Figure 5:
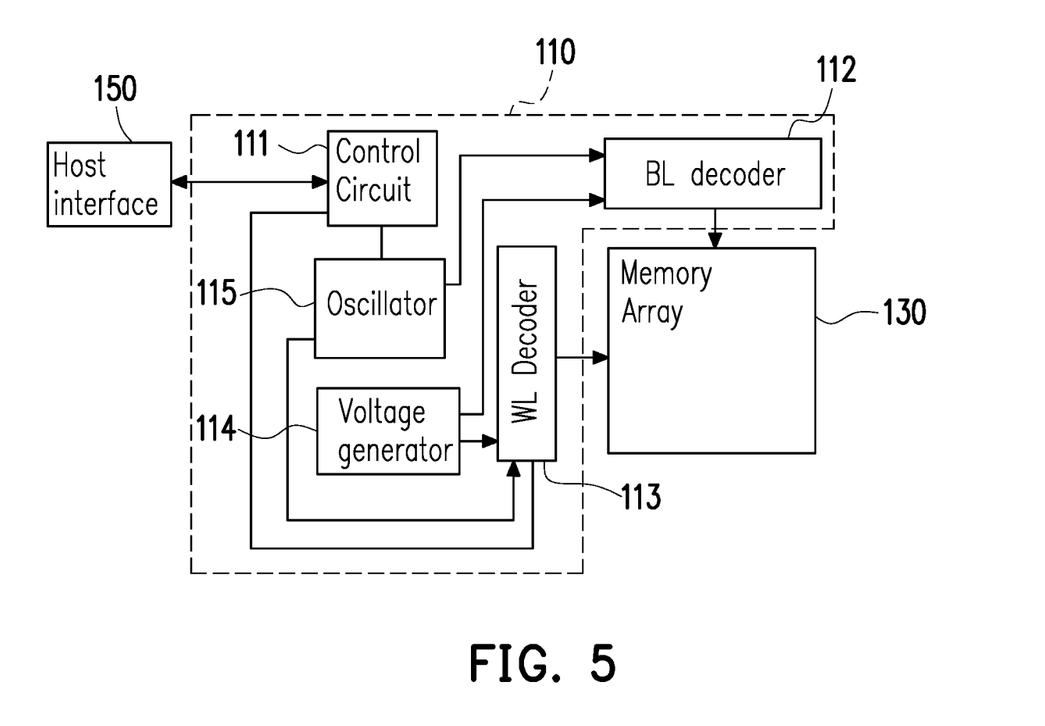
FIG. 5 is a block diagram illustrating a write and read circuit according to some exemplary embodiments of the disclosure.

FIG. 5 is a block diagram illustrating a write and read circuit 110 according to some exemplary embodiments of the disclosure. The write and read circuit 110 includes a control circuit 111, a bit line decoder 112, a word line decoder 113, a voltage generator 114, and an oscillator 115. The control circuit 111 is connected to the bit line decoder 112, the word line decoder 113, and the oscillator 115, and controls all of the operations of the non-volatile memory device 100. For example, the control circuit 111 receives command and data from the host interface 150. The control circuit 11 may control the BL decoder 112 and the WL decoder 113 to select the word lines WL and bit lines BL according to an address corresponding to the received command. Then, the BL decoder 112 and the WL decoder 113 pass a signal generated by the voltage generator 114, as to apply the signal to the resistive memory cells specified by the address corresponding to the received command. The resistive state of the resistive memory cells may be read or programmed (written) based on the operation of the control circuit 111 described above.

As described above, charges may be stuck in the insulating layer and typical constant voltage may be incapable of penetrating the shielding effect of the insulating layer during a write operation. In the exemplary embodiments, the control circuit 111 further controls the oscillator 115 to generate and output the perturbation signal during a write phrase. The perturbation signal is a high frequency oscillation signal or an AC signal, which would be capable of penetrating the shielding effect of the insulating layer. With reference to FIG. 5, the oscillator 115 is connected to the BL decoder 112 and the WL decoder 113, where the oscillator 115 may output the perturbation signal to the WL decoder 113 and/or the BL decoder 112.

Figure 6:
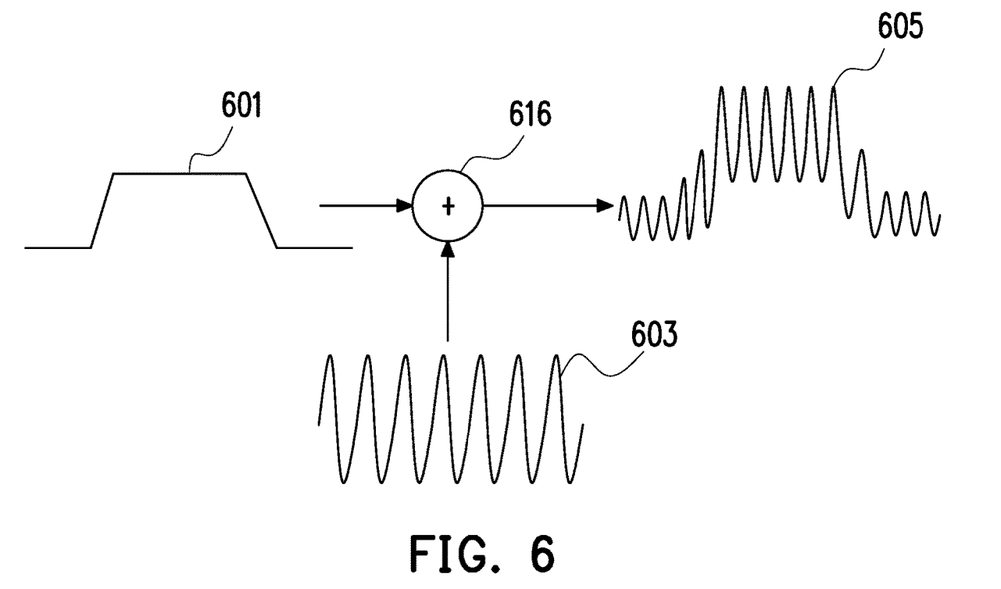
FIG. 6 is diagram illustrating an adder circuit according to some exemplary embodiments of the disclosure.

In the exemplary embodiments, each of the BL decoder 112 and the WL decoder 113 may include an adder circuit 616. FIG. 6 is diagram illustrating the adder circuit 616 according to some exemplary embodiments of the disclosure. A first terminal of the adder circuit 616 is coupled to the voltage generator 114 to receive a constant voltage 601. A second terminal of the adder circuit 616 is coupled to the oscillator 115 to receive the perturbation signal 603. The adder circuit 616 combines the constant signal 601 (also referred to as a first writing signal) generated by the voltage generator 114 and the perturbation signal 603 generated by the oscillator 115 together and generates a writing signal 605 having the electrical characteristics of both of the constant signal 601 and the perturbation signal 603.

Then, the BL decoder 112 or the WL decoder 113 may apply the second writing signal 605 to the memory array 130 for programming the selected resistive memory cells to a first resistive state from a second resistive state. Specifically, the exemplary embodiments combine the perturbation signal 603 with the first writing signal 601 when a resistive memory cell is to be programmed from the low resistive state (second resistive state) to the high resistive state (first resistive state). This write operation (a RESET operation that programs memory cell from low to high resistive state) is known to have stuck charges in the insulating layer. The programming of a memory cell from the low resistive state to the high resistive state becomes unreliable when only the constant writing signal 601 is applied. By adding the perturbation signal 603 (high frequency AC component) to the constant writing signal 601, the AC component would penetrate the shielding effect and give the charge enough energy to break free.

Figure 7:
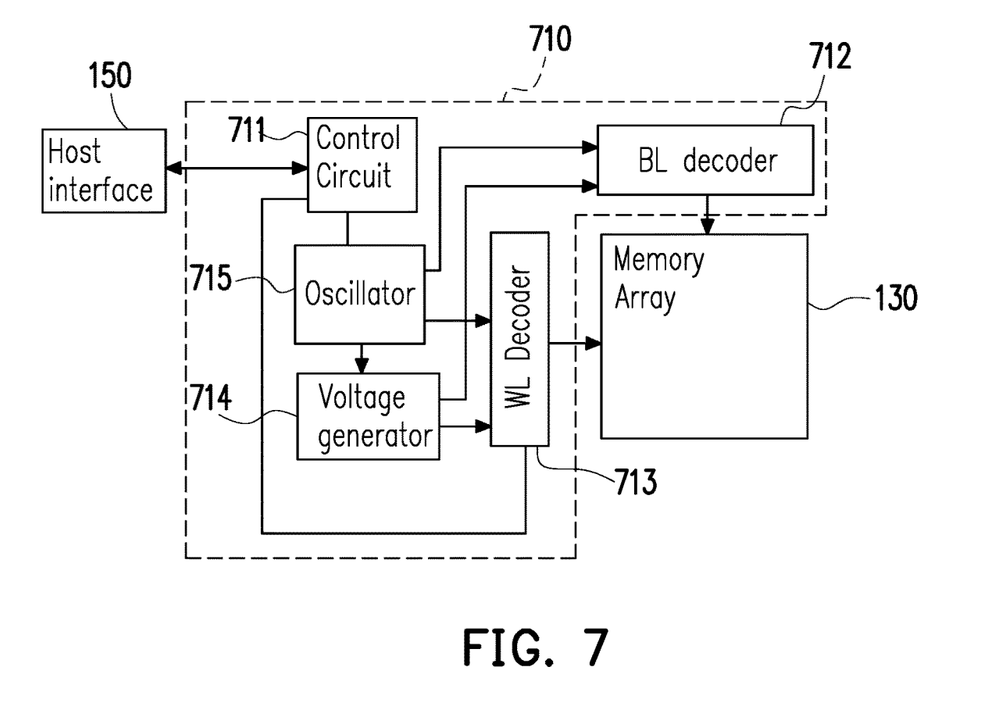
FIG. 7 is a diagram illustrating a write and read circuit 710 according to some exemplary embodiments of the disclosure.

FIG. 7 is a diagram illustrating a write and read circuit 710 according to some exemplary embodiments of the disclosure. Similar to the write and read circuit 110 illustrated in FIG. 5, the write and read circuit 710 includes a control circuit 711, a BL decoder 712, a WL decoder 713, a voltage generator 714, and an oscillator 715. In the exemplary embodiments illustrated in FIG. 7, the oscillator 715 is coupled to the voltage generator 714. The adder circuit 616 illustrated in FIG. 6 is included in the voltage generator 714, as to combine the constant writing voltage 601 and the perturbation signal 603 when determined that a resistive memory cell is to be programmed from low resistive state (i.e., second resistive state) to high resistive state (i.e., first resistive state). In detail, the control circuit 711 controls the oscillator 715 to generate and output a perturbation signal when the control circuit 711 determines that a resistive memory cell is to be programmed to the high resistive state from the low resistive state, i.e., RESET operation of the resistive memory cell. When the voltage generator 714 receives the perturbation signal, the adder circuit 616 combines the first write signal that is to be generated by the voltage generator 714 with the received perturbation signal, as to generate the second write signal. Then, the voltage generator 714 outputs the second write signal to the BL decoder 712 and/or the WL decoder 713 for programming of the resistive memory cell.

In the exemplary embodiments, if the command received from the host 150 is not to program the resistive memory cell from the low resistive state to the high resistive state, the control circuit 711 would not enable the oscillator 715 to generate the perturbation signal. Thus, the voltage generator would output the first writing signal, which is a constant signal, only to the BL decoder 712 and/or WL decoder 713. This would occur when the control circuit 711 is to program a resistive memory cell from high to low resistive state, or when the control circuit 711 is to perform a read operation.

Although the exemplary embodiments described above illustrates that the generation of the perturbation signal occurs when it is determined that the resistive memory cell is to be programmed from low to high resistive state (i.e., RESET operation), the disclosure is not limited thereto. In some exemplary embodiments, the generation of the perturbation signal and combination of the perturbation signal and the first writing signal may also occur for the programming of a resistive memory cell from high to low resistive state (i.e., SET operation).

The exemplary embodiments described above illustrate that the adder circuit 616 may be included in the BL decoder 712, the WL decoder 713, or the voltage generator 714 as to generate a second writing signal having constant signal and oscillation signal components. However, the exemplary embodiments are not intended to limit the location of the adder circuit. In some exemplary embodiments, an adder circuit may be disposed independently and separately from the BL/WL decoders 712, 713 and the voltage generator 714. For example, the adder circuit may be disposed between the voltage generator 714 and BL/WL decoders 712, 713, or in other exemplary embodiments, the adder circuit may be disposed between the memory array 130 and the BL/WL decoders 712, 713.

Figure 8:
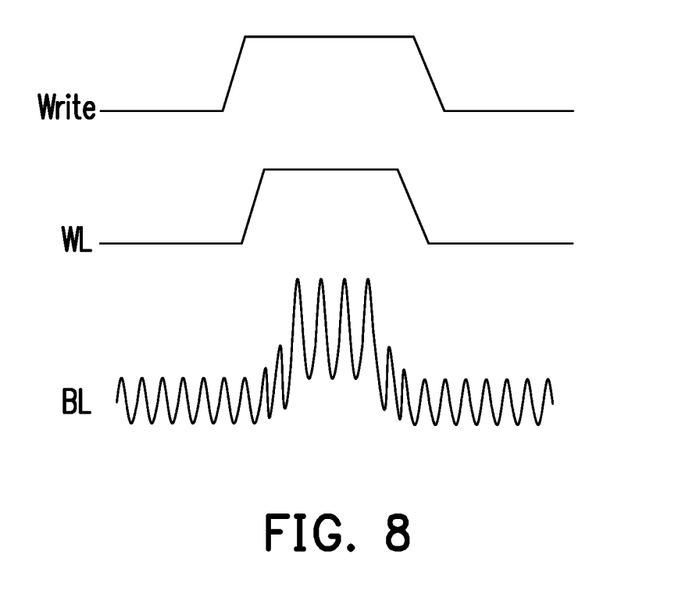
FIG. 8 is a diagram illustrating signals being applied to the word line WL and a bit line BL for performing a write operation according to some exemplary embodiments.

FIG. 8 is a diagram illustrating signals being applied to the word line WL and a bit line BL for performing a write operation according to some exemplary embodiments. Instead of applying the perturbation signal to the word line WL, the perturbation may be applied to the bit line BL. This would have similar effect as the perturbation signal being applied to the word line WL.

Figure 9:
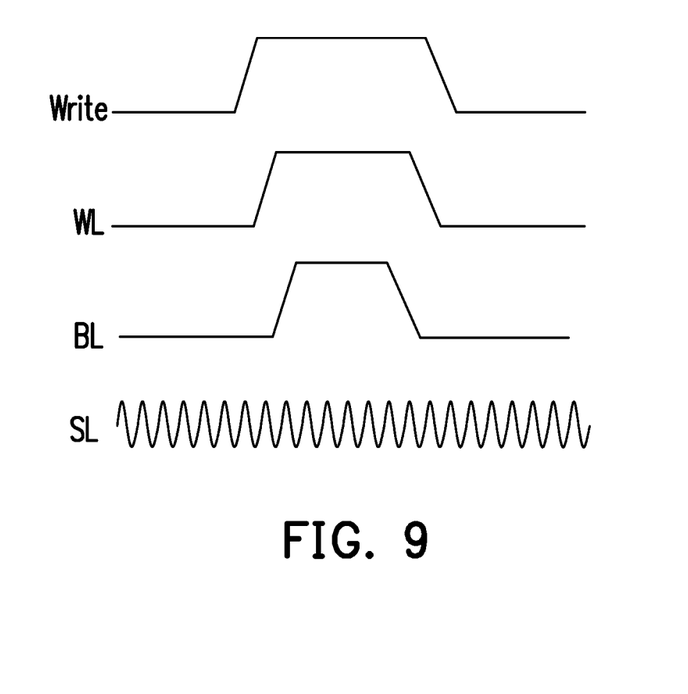
FIG. 9 is a diagram illustrating signals being applied to a word line SL, a bit line BL, and a source line SL according to some exemplary embodiments.

FIG. 9 is a diagram illustrating signals being applied to a word line SL, a bit line BL, and a source line SL during a write phase according to some exemplary embodiments. Instead of applying the perturbation signal to the word line WL or the bit line BL as illustrated in FIGS. 4 and 8, the perturbation may be applied to the source line SL. This would have similar effect as the perturbation signal being applied to the word line WL or the bit line BL.

Figure 10:
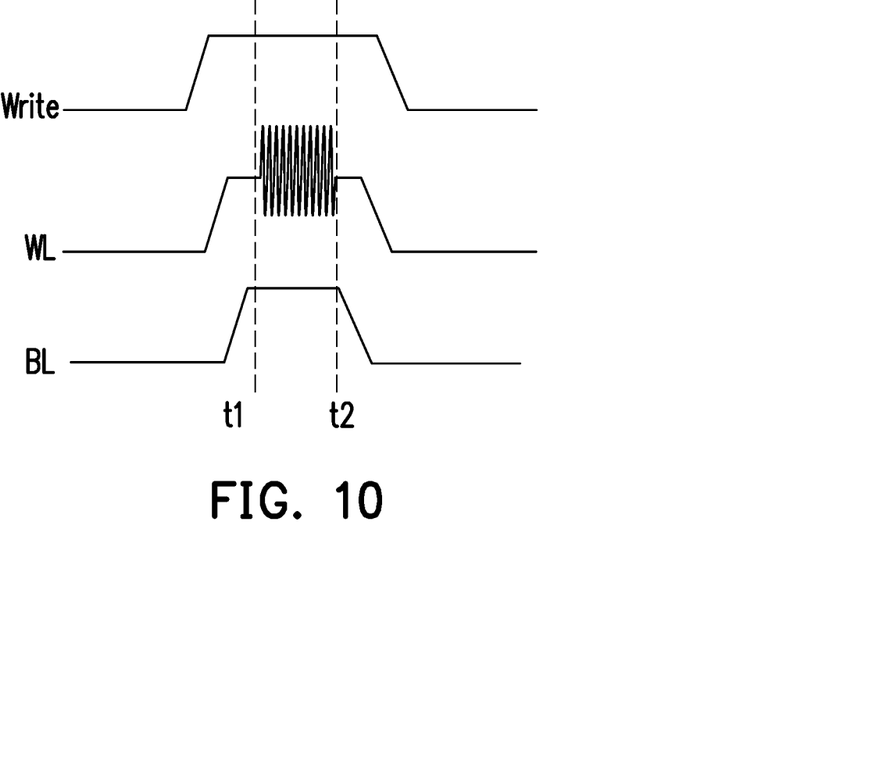
FIG. 10 is a diagram illustrating a perturbation signal according to some exemplary embodiments of the disclosure.

FIG. 10 is a diagram illustrating a perturbation signal according to some exemplary embodiments of the disclosure. In order to penetrate the shielding effect of the insulating layer, the perturbation signal is added to the constant write signal of the word line WL, the bit line BL, or the source line SL. In the exemplary embodiments, the signal applied on the word line WL is utilized for the purpose of illustration, the same concept may be applied to the signal being applied to the bit line BL or the source line SL. The perturbation signal is applied to a portion of the constant writing voltage during a write phase. With reference to FIG. 10, the perturbation signal is being applied from a first time point t1 to a second time point t2. The control circuit 110, 710 may enable the oscillator 115, 715 to generate the perturbation signal only for a period of time between the first and second time points t1, t2.

Figure 11:
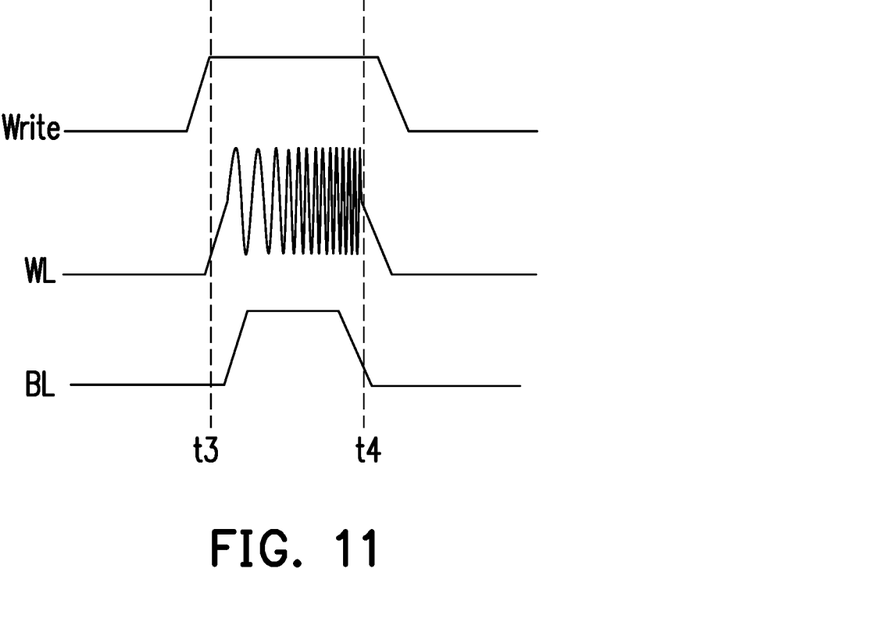
FIG. 11 is a diagram illustrating a perturbation signal according to some exemplary embodiments of the disclosure.

FIG. 11 is a diagram illustrating a perturbation signal according to some exemplary embodiments of the disclosure. In the exemplary embodiments, the perturbation signal may be configured to have various frequency during a time period between a third time point t3 and a fourth time point t4. This may also be referred to frequency sweep during the defined time period.

Figure 12:
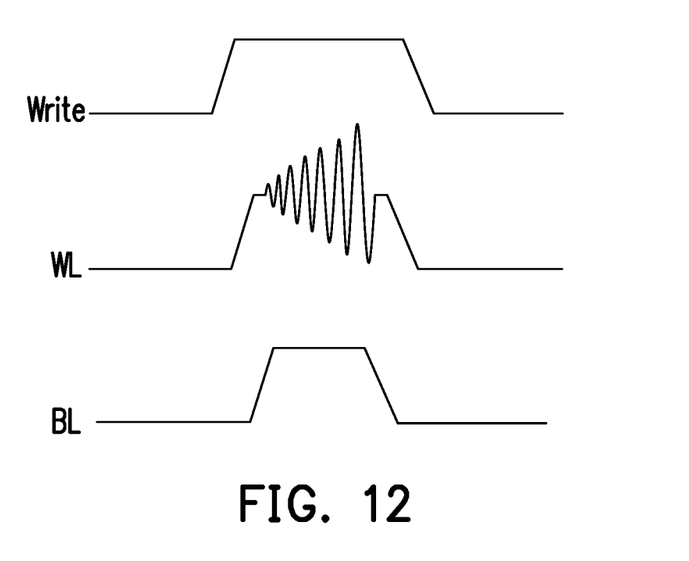
FIG. 12 is a diagram illustrating a perturbation signal according to some exemplary embodiments of the disclosure.

FIG. 12 is a diagram illustrating a perturbation signal according to some exemplary embodiments of the disclosure. In the exemplary embodiments, the perturbation signal may be configured to have various amplitudes. This may also be referred to as amplitude sweep during a period of time.

Figure 13:
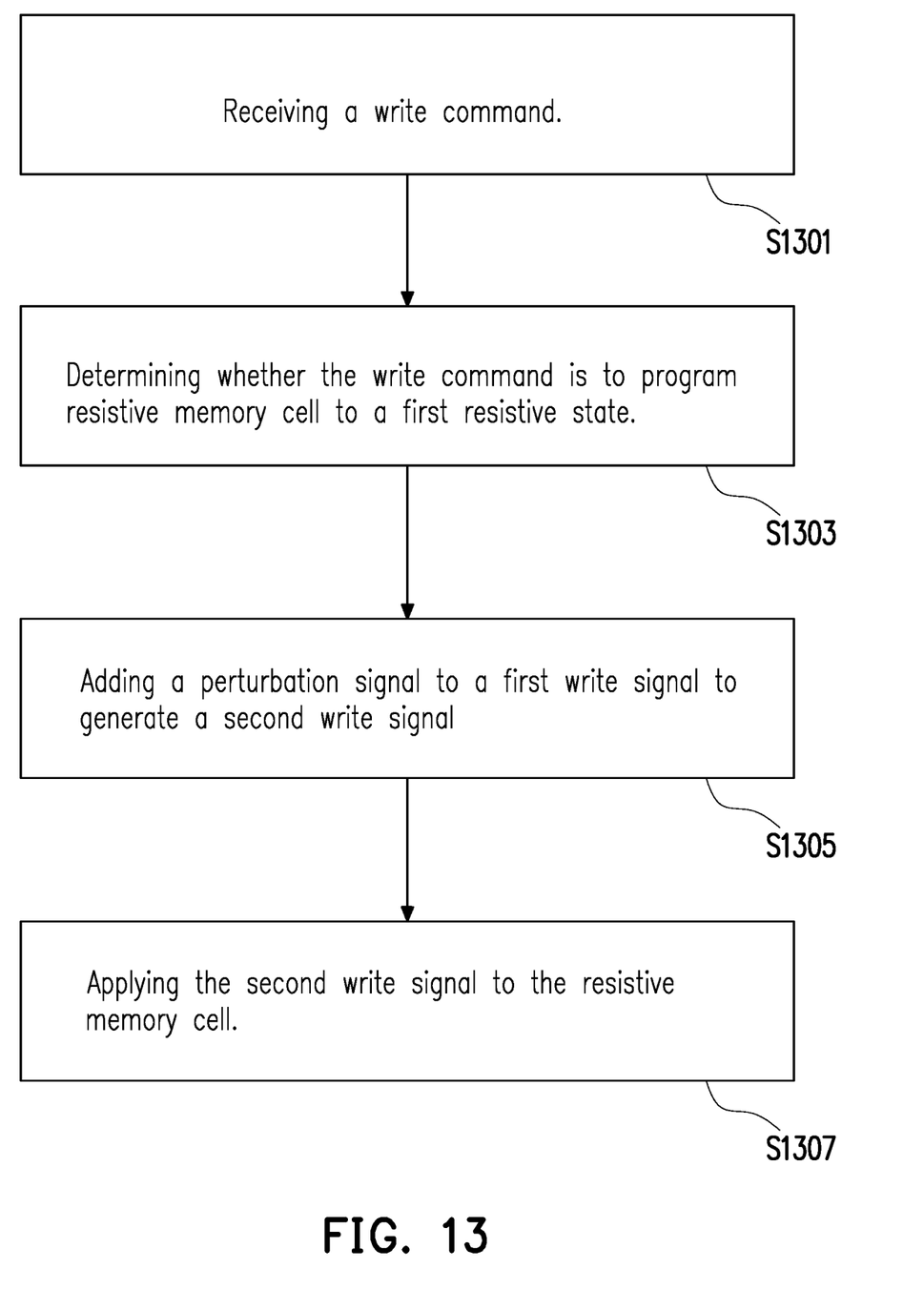
FIG. 13 is a flow diagram illustrating a method for programming a resistive memory cell of a non-volatile memory device according to some exemplary embodiments of the disclosure.

FIG. 13 is a flow diagram illustrating a method for programming a resistive memory cell of a non-volatile memory device according to some exemplary embodiments of the disclosure. In step S1301, the non-volatile memory device may receive a write command.

In step S1303, a control circuit of the non-volatile memory device determines whether the write command is to program a resistive memory cell to a first (low) resistive state from a second (high) resistive state.

In step S1305, when determined that a resistive memory cell is to be programmed to the first resistive state, the control circuit generates a perturbation signal. Then, the perturbation signal is added to a first write signal as to generate a second write signal for programming the resistive memory cell from the second resistive state to the first resistive state.

In step S1307, the second write signal is then applied to the resistive memory cell. Based on the second write signal, the resistive memory cell may be programmed to the first resistive state with a higher successful rate as compared to the first write signal which is a constant DC voltage.

Based on the various exemplary embodiments described above, a control circuit of a non-volatile memory may be configured to or programmed to control an oscillator for generating an AC signal (high frequency oscillation signal). Then, the generated AC signal is combined with a write signal having constant DC signal (voltage or current). The combination of the oscillation signal and the constant DC signal and AC signal would penetrate the shielding effect of the insulating layer and free the stuck charges.

The above exemplary embodiments are illustrated to show the normal access or testing of memory cell(s). For example, the exemplar embodiments may be implemented for various field applications of RRAM, such as eRRAM, cache, DRAM, and flash replacement. The disclosure is not limited thereto. In some exemplary embodiments, the above programming method of RRAM may be applied to memory cells of a RRAM chip during manufacturing as a testing procedure of chip(s) on the wafer. In that case, the write/read circuit 110 for applying programming voltages to memory cell(s) may be disposed on the scribe lines between chip areas or on the chip itself.

According to some exemplary embodiments, a non-volatile memory device is disclosed. The non-volatile memory device includes a resistive memory cell and a write and read circuit. The write and read circuit is coupled to the resistive memory cell and configured to combine a perturbation AC signal to a first writing signal to generate a second writing signal and apply the second writing signal to the resistive memory cell to program the resistive memory cell.

According to some exemplary embodiments, a method of programming a resistive memory cell is disclosed. In the exemplary embodiments, the resistive memory cell includes a first terminal coupled to a bit line, a second terminal couple to a word line, and a third terminal coupled to a source line. The method includes at least the following steps: obtaining a perturbation AC signal and a first writing signal, combining the perturbation AC signal and the first writing signal to generate a second writing signal, and applying the second writing signal to the resistive memory cell to program the resistive memory cell.

According to some exemplary embodiments, a non-volatile memory is disclosed. The non-volatile memory includes a memory array and a memory controller. The memory array includes a plurality of resistive memory cells, each connected to a bit line and a word line. The memory controller, coupled to the memory array, and configured to generate an oscillated writing signal at least based on a writing signal and an oscillation signal, and to program at least one of the resistive memory cells based on the oscillated writing voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory device, comprising:
   a resistive memory cell; and
   a write and read circuit, coupled to the resistive memory cell, and configured to combine a perturbation AC signal with a first writing signal, so as to generate a second writing signal having a same period as the first writing signal and apply the second writing signal to the resistive memory cell to program the resistive memory cell.

2. The non-volatile memory device of claim 1, wherein the resistive memory cell is programmed to a high resistance state from a low resistance state based on the second writing signal.

3. The non-volatile memory device of claim 1, further comprising:
   a voltage generator, coupled to the write and read circuit, generating the first writing signal; and
   an oscillator, coupled to the write and read circuit, generating the perturbation AC signal, wherein the AC signal is a high frequency oscillation signal.

4. The non-volatile memory device of claim 1, wherein the write and read circuit comprises an adder circuit, combining the perturbation AC signal with the first writing signal, wherein the perturbation AC signal is a high frequency oscillation signal.

5. The non-volatile memory device of claim 1, wherein the resistive memory cell comprises:
   a resistive element, having a first terminal coupled to a bit line and a second terminal; and
   a switching element, having a first terminal coupled to the second terminal of the resistive element, a second terminal coupled to a source line, and a control terminal coupled to a word line,
   wherein the resistive memory cell is coupled to the write and read circuit through the bit line, the word line, and the source line.

6. The non-volatile memory device of claim 5, wherein the write and read circuit applies the second writing signal to the resistive memory cell through the bit line.

7. The non-volatile memory device of claim 5, wherein the write and read circuit applies the second writing signal to the resistive memory cell through the word line.

8. The non-volatile memory device of claim 5, wherein the write and read circuit applies the second writing signal to the resistive memory cell through the source line.

9. The non-volatile memory device of claim 1, wherein the perturbation AC signal is a high frequency oscillation signal having a frequency and/or an amplitude varies in time, wherein a frequency and/or an amplitude of the second writing signal varies in time.

10. The non-volatile memory device of claim 1, the perturbation AC signal is superimposed to a portion of the first writing signal during a write cycle of the resistive memory cell.

11. A method of programming a resistive memory cell, wherein the resistive memory cell comprises a first terminal coupled to a bit line, a second terminal coupled to a word line, and a third terminal coupled to a source line, wherein the method comprises:
    obtaining a perturbation AC signal and a first writing signal;
    combining the perturbation AC signal and the first writing signal to generate a second writing signal having a same period as the first writing signal; and
    applying the second writing signal to the resistive memory cell to program the resistive memory cell.

12. The method of claim 11, further comprising:
    receiving a write command;
    determining whether the write command is to program resistive memory cell to a first resistive state; and
    combining the perturbation AC signal and the first writing signal to generate the second writing signal when determined that the write command is to program the resistive memory cell from a second resistive state to the first resistive state.

13. The method of claim 11, wherein the resistive memory cell is programmed to a high resistive state from a low resistive state based on the second writing signal.

14. The method of claim 11, wherein the second writing signal is applied to the resistive memory cell through the bit line.

15. The method claim 11, wherein the second writing signal is applied to the resistive memory cell through the word line.

16. The method of claim 11, wherein the perturbation AC signal has a frequency and/or an amplitude varies in time, and the combination of the perturbation AC signal and the first writing signal generates the second writing signal having the frequency and/or the amplitude of the perturbation AC signal.

17. A non-volatile memory, comprising:
    a memory array, comprising a plurality of resistive memory cells, each resistive memory cell connected to a bit line and a word line;
    a memory controller, coupled to the memory array, and configured to generate an oscillated writing signal at least based on a writing signal and an oscillation signal, and program at least one of the resistive memory cells based on the oscillated writing signal, wherein a period of the writing signal is different from a period of the oscillation signal.

18. The non-volatile memory of claim 17, wherein the memory controller is further configured to receive a write command and determine whether the write command is to program the at least one of resistive memory cells from a low resistive state to a high resistive state, wherein the memory controller is further configured to generate the oscillation signal and combine the writing signal and the oscillation signal when determined that the at least one of the resistive memory cells is to be programmed from the low resistive state to the high resistive state.

19. The non-volatile memory of claim 17, wherein the write and read circuit is configured to apply the oscillated writing signal to the memory array through the bit line.

20. The non-volatile memory of claim 17, wherein the write and read circuit is configured to apply the oscillated writing signal to the memory array through the word line.

* * * * *